(12) United States Patent
Yeh et al.

(10) Patent No.: US 9,147,675 B2
(45) Date of Patent: Sep. 29, 2015

(54) INTEGRATED CIRCUIT

(71) Applicant: REALTEK SEMICONDUCTOR CORP., HsinChu (TW)

(72) Inventors: Ta-Hsun Yeh, HsinChu (TW); Tay-Her Tsaur, HsinChu (TW); Chien-Ming Wu, HsinChu (TW)

(73) Assignee: REALTEK SEMICONDUCTOR CORP., HsinChu (TW)

( * ) Notice: Subject to any disclaimer, the term of this patent is extended or adjusted under 35 U.S.C. 154(b) by 0 days.

(21) Appl. No.: 14/011,270

(22) Filed: Aug. 27, 2013

(65) Prior Publication Data

US 2014/0061881 A1 Mar. 6, 2014

(30) Foreign Application Priority Data

Sep. 4, 2012 (TW) .............................. 101132194 A

(51) Int. Cl.
*H01L 27/02* (2006.01)
*H01L 23/00* (2006.01)
*H01L 23/60* (2006.01)

(52) U.S. Cl.
CPC ............ *H01L 27/0248* (2013.01); *H01L 23/60* (2013.01); *H01L 24/48* (2013.01); *H01L 24/49* (2013.01); *H01L 2224/05554* (2013.01); *H01L 2224/16145* (2013.01); *H01L 2224/48091* (2013.01); *H01L 2224/48111* (2013.01); *H01L 2224/48137* (2013.01); *H01L 2224/48145* (2013.01); *H01L 2224/49175* (2013.01); *H01L 2924/13034* (2013.01); *H01L 2924/15311* (2013.01)

(58) Field of Classification Search
CPC ...... H01L 23/60; H01L 24/48; H01L 27/0248
USPC .......................................................... 257/666
See application file for complete search history.

(56) References Cited

U.S. PATENT DOCUMENTS 6,753,204 B1 * 6/2004 Mayer ........................... 438/107

FOREIGN PATENT DOCUMENTS

TW 200305276 10/2003
TW 561595 11/2003

* cited by examiner

*Primary Examiner* — Roy Potter
(74) *Attorney, Agent, or Firm* — Muncy, Geissler, Olds & Lowe, P.C.

(57) ABSTRACT

An integrated circuit (IC) includes a packaging body, multiple interface connectors, a functional chip, and an electrostatic discharge (ESD) protection chip. The interface connectors are located on an outer surface of the packaging body. The functional chip has an electronic functional circuit, and the ESD protection chip has an ESD protection circuit. The ESD protection circuit is connected electrically to an interface connector serving as a data exchange path.

18 Claims, 4 Drawing Sheets

INTEGRATED CIRCUIT

CROSS-REFERENCES TO RELATED APPLICATIONS

This non-provisional application claims priority under 35 U.S.C. §119(a) on Patent Application No. 101132194 filed in Taiwan, R.O.C. on Sep. 4, 2012, the entire contents of which are hereby incorporated by reference.

BACKGROUND

1. Technical Field

The present invention relates to an integrated circuit (IC) having Electrostatic Discharge (ESD) protection circuits.

2. Related Art

During operation of electronic elements, ESD is a main factor causing most of the electronic elements or electronic systems to be damaged due to Electrical Overstress (EOS); in particular, in the case that a process of the electronic elements is more and more precise, and the size thereof is more and more small, the ESD effect easily breaks down the electronic elements and causes a permanent damage to semiconductor elements and computer systems, resulting in relevant electronic products being affected and relevant devices functioning abnormally.

In a procedure of manufacturing, producing, assembling, testing, storing, or transporting the electronic elements or the electronic systems, electrostatic force is accumulated in human bodies, the electronic elements, and various electronic devices or instruments. When the objects with the electrostatic force contact with each other, an ESD discharge path is formed, so that the electronic elements or the electronic devices are unpredictably damaged.

ESD protection circuits are specially used for ESD protection in an IC. The ESD protection circuits provide an electrostatic force discharge path, so as to avoid the electrostatic force flowing into an internal circuit of the IC and causing damage, when ESD occurs.

Generally, the ESD protection circuits are designed beside an input/output (I/O) pad, a power pad, or a ground pad of the IC. However, with the evolution of the process, the price of the process continues to increase. A cost-reduction design still cannot be applied to an area of the pad with the evolution of the process. However, with the continuously reduced size of the elements in the IC, the circuit elements are more sensitive to the damage caused by the ESD. Therefore, an ESD protection hierarchy must be strengthened, and thus the area of the pad necessarily must be enlarged, thereby increasing the whole cost of the IC. In this way, in various design programs of the IC, the ESD-related reliability and cost must necessarily be taken into consideration.

SUMMARY

In an embodiment, an IC includes a packaging body, multiple interface connectors, a functional chip, and an ESD protection chip. The functional chip includes a first power pad, a first ground pad, a first signal pad, and an electronic functional circuit. The ESD protection chip includes a second signal pad and a first ESD protection circuit.

The interface connectors are located on an outer surface of the packaging body. The first power pad is connected electrically to a first one of the interface connectors, and the first ground pad is connected electrically to a second one of the interface connectors. The electronic functional circuit is connected electrically to the first power pad, the first signal pad, and the first ground pad. The second signal pad is connected electrically between a third one of the interface connectors and the first signal pad. The first ESD protection circuit is connected electrically to the second signal pad.

To sum up, in the IC of the present invention, the electronic functional circuit and the ESD protection circuit of the IC are separately fabricated in two chips (that is, the functional chip and the ESD protection chip), so that the selection of process technology and the circuit design are more flexible, thereby relatively reducing the cost.

BRIEF DESCRIPTION OF THE DRAWINGS

The disclosure will become more fully understood from the detailed description given herein below for illustration only, and thus not limitative of the present invention, wherein.

DETAILED DESCRIPTION

The terms "first", "second", and "third" described below are used to differentiate the signified elements, are not intended to sort or restrict the signified elements to indicate the difference, and also not intended to limit the scope of the present invention.

Please referring to FIG. 1 to FIG. 7, an IC 100 includes a packaging body 110, multiple interface connectors 130, a functional chip 150, and an ESD protection chip 170.

Figure 4:
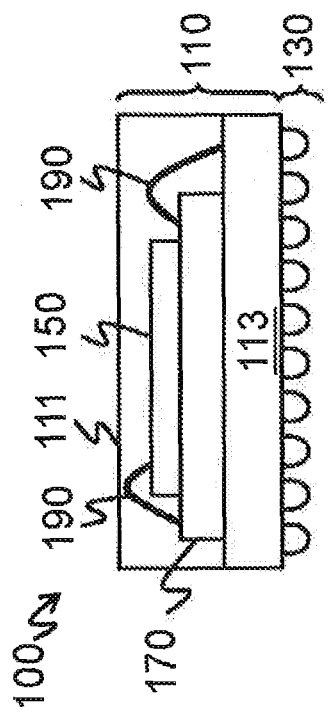
FIG. 4 is a schematic sectional view of an IC according to a fourth embodiment of the present invention.
Figure 5:
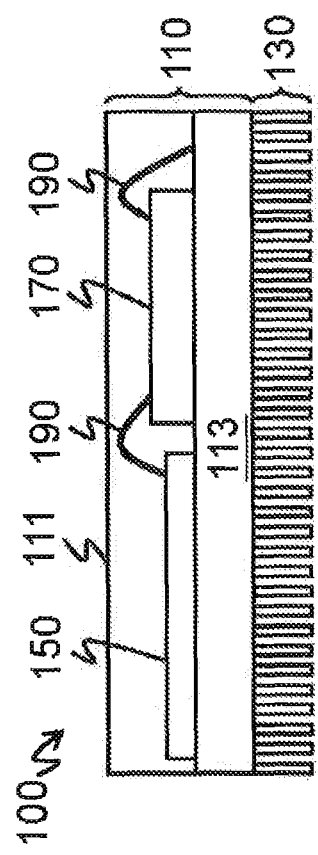
FIG. 5 is a schematic sectional view of an IC according to a fifth embodiment of the present invention.
Figure 6:
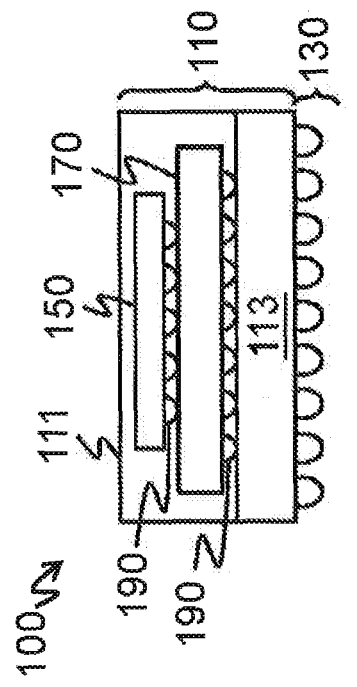
FIG. 6 is a schematic sectional view of an IC according to a sixth embodiment of the present invention.
Figure 7:
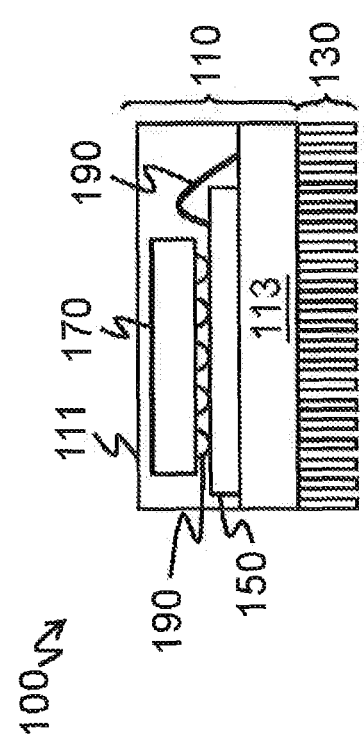
FIG. 7 is a schematic sectional view of an IC according to a seventh embodiment of the present invention.

The interface connectors 130 are located on an outer surface of the packaging body 110, that is, exposed on a surface of the IC 100. In the IC 100, the interface connector 130 is directly jointed to an external circuit board (not shown) or is indirectly jointed to the external circuit board through a socket (not shown), so that the chips in the IC 100 are connected electrically to wires in the circuit board through the interface connectors 130. A joint manner of the IC circuit 100 and the external circuit is known to persons skilled in the art, so the details are not described herein again. In some embodiments, the interface connector 130 may be a pin (as shown in FIG. 4 and FIG. 6), or a solder ball (as shown in FIG. 5 and FIG. 7).

The functional chip 150 includes a first power pad 151, a first ground pad 153, a first signal pad 155, and an electronic functional circuit 157.

The first power pad 151 is connected electrically to a first one (referred to as a first connector 131 below), of the interface connectors 130. Here, the first connector 131 provides a transmission path with an external power level, so as to receive a power supply required for operation from an outside of the IC 100.

The first ground pad 153 is connected electrically to a second one (referred to as a second connector 133 below), of the interface connectors 130. Here, the second connector 133 provides a transmission path with an external ground level, so that the IC 100 is conducted to external ground.

The electronic functional circuit 157 is connected electrically to the first power pad 151, the first ground pad 153, and the first signal pad 155. Here, the electronic functional circuit 157 is used to provide electronic functional operation for the IC 100.

The ESD protection chip 170 includes a second signal pad 175 and an ESD protection circuit 177.

The second signal pad 175 is connected electrically between a third one (referred to as a third connector 135 below) of the interface connectors 130 and the first signal pad 155. Here, the third connector 135 provides a data exchange path with an external circuit.

The first ESD protection circuit 177 is connected electrically to the second signal pad 175.

In some embodiments, the functional chip 150 and the ESD protection chip 170 are formed in a single IC 100 using System on Package (SOP) technology, that is, formed into a single packaging body 110. In other words, the functional chip 150 and the ESD protection chip 170 are two structurally separated bare chips.

Figure 1:
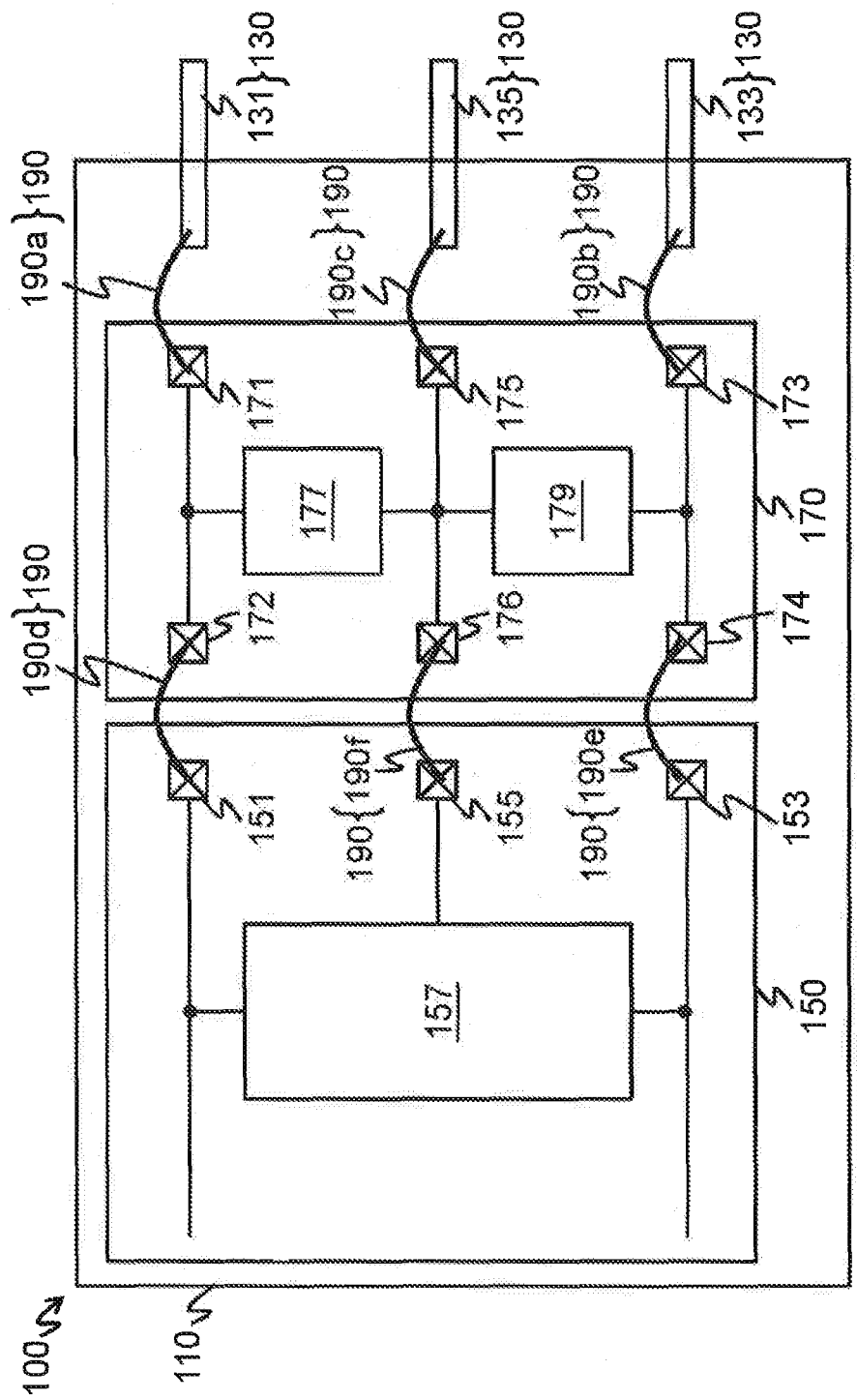
FIG. 1 is a schematic view of an IC according to a first embodiment of the present invention.

In some embodiments, please referring to FIG. 1, the ESD protection chip 170 may further include a second power pad 171, a second ground pad 173, and a second ESD protection circuit 179.

Here, the first ESD protection circuit 177 is connected electrically between the second signal pad 175 and the second power pad 171, and the second ESD protection circuit 179 is connected electrically between the second signal pad 175 and the second ground pad 173. In some embodiments, another ESD protection circuit (not shown), may be further connected electrically between the second power pad 171 and the second ground pad 173. In other words, the ESD protection circuit may be designed between any two pads with different properties, so as to provide a discharge path.

The integrated circuit 100 may further include multiple jointers 190. The jointers 190 are respectively jointed between the first connector 131 and the second power pad 171, between the second connector 133 and the second ground pad 173, and between the third connector 135 and the second signal pad 175. For example, two ends of the jointer 190a are jointed to the first connector 131 and the second power pad 171 respectively; two ends of the jointer 190b are jointed to the second connector 133 and the second ground pad 173 respectively; and two ends of the jointer 190c are jointed to the third connector 135 and the second signal pad 175 respectively.

Here, the second power pad 171 and the third power pad 172 may be two pads separated from each other, or may be integrated into a single pad. The second ground pad 173 and the third ground pad 174 may be two pads separated from each other, or may be integrated into a single pad. The second signal pad 175 and the third signal pad 176 may be two pads separated from each other, or may be integrated into a single pad.

Here, in some embodiments, the first power pad 151, the first ground pad 153, and the first signal pad 155 of the functional chip 150 may be connected electrically, through the jointer 190 and the ESD protection chip 170, to the first connector 131, the second connector 133, and the third connector 135 respectively. The ESD protection chip 170 may further include a third power pad 172, a third ground pad 174, and a third signal pad 176.

The third power pad 172 is connected electrically to the second power pad 171, the third ground pad 174 is connected electrically to the second ground pad 173, and the third signal pad 176 is connected electrically to the second signal pad 175.

Two ends of the jointer 190d are jointed to the first power pad 151 and the third power pad 172 respectively; two ends of the jointer 190e are jointed to the first ground pad 153 and the third ground pad 174 respectively; and two ends of the jointer 190f are jointed to the first signal pad 155 and the third signal pad 176 respectively.

In some embodiments, the first power pad 151, the first ground pad 153, and the first signal pad 155 of the functional chip 150 may be connected electrically, directly through the jointer 190, to the first connector 131, the second connector 133, and the third connector 135 respectively. In other words, please referring to FIG. 2, two ends of the jointer 190g are jointed to the first power pad 151 and the first connector 131 respectively, and two ends of the jointer 190h are jointed to the first ground pad 153 and the second connector 133 respectively.

In some embodiments, the two ends of the jointer 190f may also be changed from being respectively jointed to the first signal pad 155 and the third signal pad 176 to being respectively jointed to the first signal pad 155 and the third connector 135 (not shown).

In some embodiments, in the chips (for example, the functional chip 150 and the ESD protection chip 170), and a bearing substrate 113 in the IC 100, any two of them may be electrically jointed using bonding wires (as shown in FIG. 4 to FIG. 6), or flip-chip (as shown in FIG. 6 and FIG. 7), or in other manners. In other words, the jointer 190 may be a bonding wire (as shown in FIG. 4 to FIG. 6), or a bump 190 (as shown in FIG. 6 and FIG. 7).

In some embodiments, the functional chip 150 may be a chip without an ESD protection circuit, as shown in FIG. 1.

Figure 2:
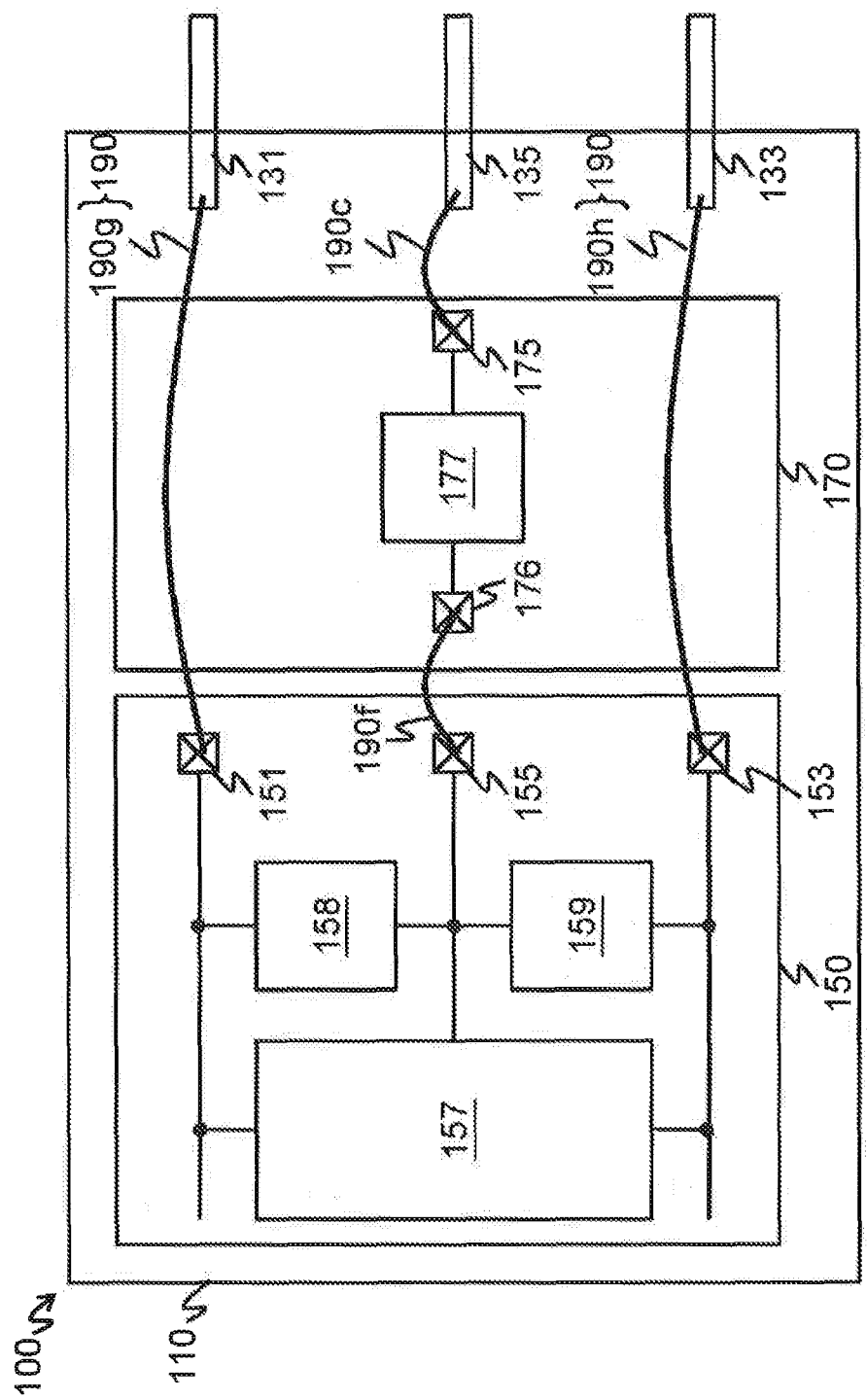
FIG. 2 is a schematic view of an IC according to a second embodiment of the present invention.
Figure 3:
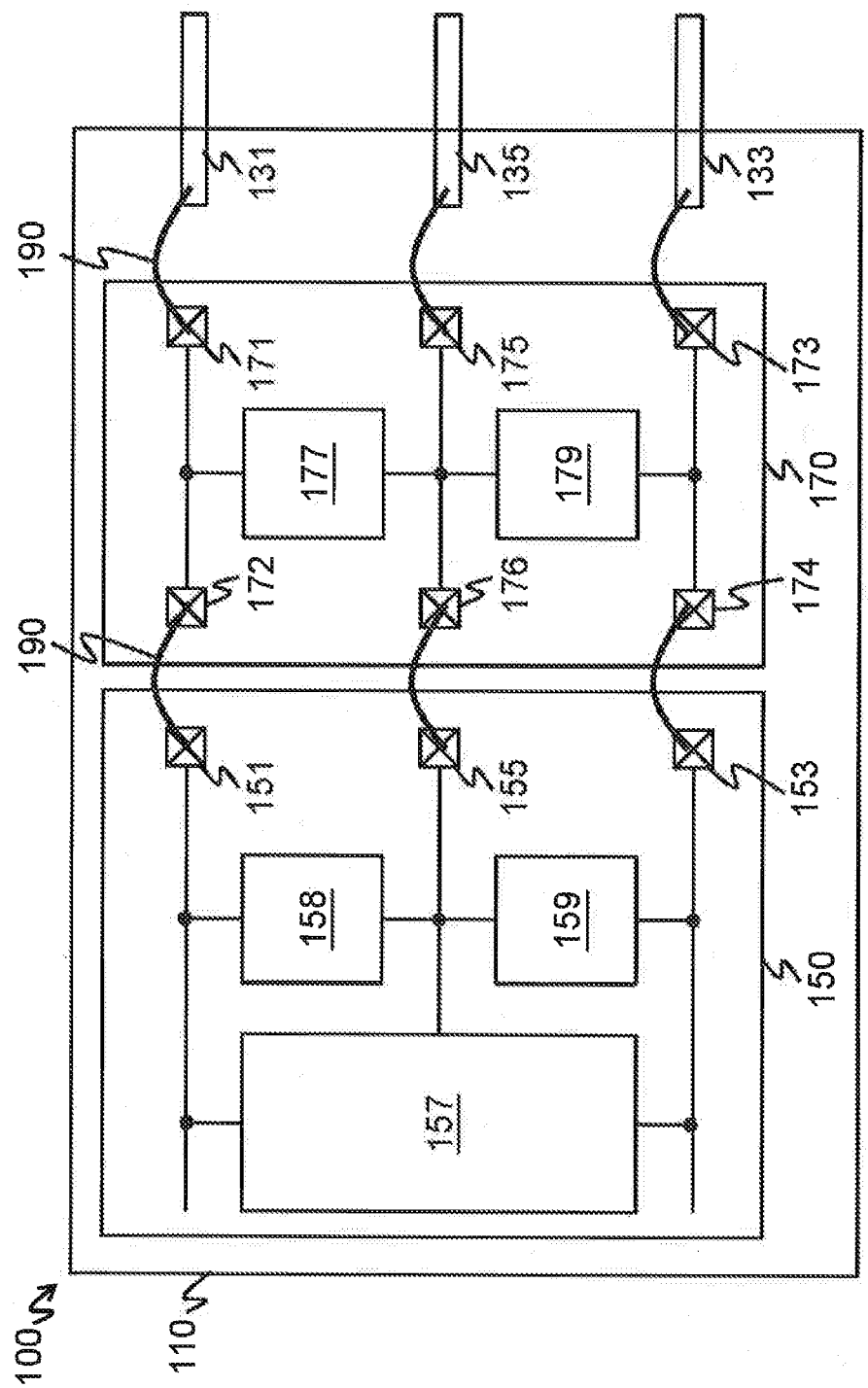
FIG. 3 is a schematic view of an IC according to a third embodiment of the present invention.

In some embodiments, please referring to FIG. 2 and FIG. 3, the functional chip 150 may further include a third ESD protection circuit 158 and a fourth ESD protection circuit 159.

The third ESD protection circuit 158 is coupled between the first power pad 151 and the first signal pad 155, and the fourth ESD protection circuit 159 is coupled between the first signal pad 155 and the first ground pad 153. In some embodiments, another ESD protection circuit (not shown), may be further connected electrically between the first power pad 151 and the first ground pad 153.

In some embodiments, a current-withstanding capability of each ESD, protection circuit in the functional chip 150 is weaker than a current-withstanding capability of each ESD protection circuit in the ESD protection chip 170. That is to say, a current-withstanding capability of the third ESD protection circuit 158 is weaker than a current-withstanding capability of each of the first ESD protection circuit 177 and the second ESD protection circuit 179; and a current-withstanding capability of the fourth ESD protection circuit 159 is weaker than a current-withstanding capability of each of the first ESD protection circuit 177 and the second ESD protection circuit 179.

That is to say, the ESD protection circuit in the functional chip 150 merely provides basic ESD protection, while the ESD protection circuit in the ESD protection chip 170 can provide high-current protection. Taking an Ethernet application as an example, the ESD protection circuit in the functional chip 150 merely provides ESD protection against discharge with a human body model (FIRM), a machine model (MM), a charged device model (CDM), or other models; while the ESD protection circuit in the ESD protection chip 170 can provide high-current protection against, for example, a lightning stroke.

Moreover, the functional chip 150 is formed using process technology different from that of the ESD protection chip 170. Preferably, the functional chip 150 is formed using process technology more advanced than that of the ESD protection chip 170. For example, the functional chip 150 is formed using 40 nm process technology, while the ESD protection chip 170 is formed using over-180 nm process technology.

In some embodiments, please referring to FIG. 2, the ESD protection chip 170 can merely provide ESD protection for a data path. Here, the ESD protection chip 170 merely has the first ESD protection circuit 177, and the first ESD protection circuit 177 is connected electrically between the first signal pad 155 and the second signal pad 175. In this embodiment, the first ESD protection circuit 177 is used to block an unexpected current flowing into the IC 100 through the third connector 135. In other words, the ESD protection. circuit may be designed between two pads with the same properties, so as to provide protection against the unexpected current.

In some embodiments, components of the ESD protection circuit may include a resistor, a diode, a transistor, a field-oxide device, a Silicon Controlled Rectifier (SCR) device (p-n-p-n structure), or a combination thereof. Since the design of the ESD protection circuit is known by persons skilled in the art, the details are not described herein again.

In some embodiments, please referring to FIG. 4 to FIG. 7, the packaging body 110 may include a encapsulating material 111. The encapsulating material 111 encapsulates the functional chip 150 and the ESD protection chip 170, so that the functional chip 150 and the ESD protection chip 170 are insulated from the outside.

In some embodiments, the packaging body 110 may further include a bearing substrate 113. The chips (for example, the functional chip 150 and the ESD protection chip 170), in the IC 100 may be disposed on the bearing substrate 113 in a parallel manner (as shown in FIG. 4) or a stacking manner (as shown in FIG. 5 and FIG. 6). Since the package technology is known by persons skilled in the art, the details are not described herein again.

To sum up, in the IC of the present invention, the electronic functional circuit and the ESD protection circuit providing a discharge path and/or blocking an unexpected current are separately fabricated in two chips (that is, the functional chip 150 and the ESD protection chip 170), so that the selection of process technology and the circuit design are more flexible, thereby relatively reducing the cost.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An integrated circuit (IC), comprising:
a packaging body;
a plurality of interface connectors, disposed on an outer surface of the packaging body;
a functional chip, comprising:
    a first power pad, connected electrically to a first one of the interface connectors;
    a first ground pad, connected electrically to a second one of the interface connectors;
    a first signal pad; and
    an electronic functional circuit, connected electrically to the first power pad, the first signal pad, and the first ground pad; and
an Electrostatic Discharge (ESD) protection chip, comprising:
    a second signal pad, connected electrically between a third one of the interface connectors and the first signal pad; and
    a first ESD protection circuit, connected electrically to the second signal pad;
wherein the functional chip is formed using process technology different from that of the ESD protection chip.

2. The IC according to claim 1, wherein the functional chip and the ESD protection chip are disposed within the packaging body.

3. The IC according to claim 1, wherein the functional chip and the ESD protection chip are two structurally separated bare chips.

4. The IC according to claim 1, wherein the ESD protection chip further comprises:
a second power pad, connected electrically between the first one of the interface connectors and the first power pad, wherein the first ESD protection circuit is connected electrically between the second signal pad and the second power pad;
a second ground pad, connected electrically between the second one of the interface connectors and the first ground pad; and
a second ESD protection circuit, coupled between the second signal pad and the second ground pad.

5. The IC according to claim 4, wherein the functional chip further comprises:
a third ESD protection circuit, coupled between the first power pad and the first signal pad; and
a fourth ESD protection circuit, coupled between the first signal pad and the first ground pad;
wherein a current-withstanding capability of each ESD protection circuit in the functional chip is weaker than a current-withstanding capability of each ESD protection circuit in the ESD protection chip.

6. The IC according to claim 4, wherein the ESD protection chip further comprises:
a third power pad, connected electrically between the second power pad and the first power pad;
a third ground pad, connected electrically between the second ground pad and the first ground pad; and
a third signal pad, connected electrically between the second signal pad and the first signal pad.

7. The IC according to claim 6, further comprising:
a plurality of jointers, jointed between the first power pad and the third power pad, between the first ground pad and the third ground pad, and between the first signal pad and the third signal pad respectively.

8. The IC according to claim 4, further comprising:
a plurality of jointers, jointed between the first one of the interface connectors and the second power pad, between the second one of the interface connectors and the second ground pad, and between the third one of the interface connectors and the second signal pad respectively.

9. The IC according to claim 4, wherein the ESD protection chip further comprises:
a third signal pad, connected electrically to the first signal pad, wherein the first ESD protection circuit is connected electrically between the second signal pad and the third signal pad.

10. The IC according to claim 9, further comprising:
a plurality of jointers, jointed between the first one of the interface connectors and the first power pad, between the second one of the interface connectors and the first ground pad, between the first signal pad and the third signal pad, and between the third one of the interface connectors and the second signal pad respectively.

11. The IC according to claim 1, wherein the functional chip further comprises:
a third ESD protection circuit, coupled between the first power pad and the first signal pad; and
a fourth ESD protection circuit, coupled between the first signal pad and the first ground pad;
wherein a current-withstanding capability of each ESD protection circuit in the functional chip is weaker than a current-withstanding capability of each ESD protection circuit in the ESD protection chip.

12. The IC according to claim 1, further comprising:
a plurality of jointers, jointed between the first one of the interface connectors and the first power pad, between the second one of the interface connectors and the first ground pad, and between the third one of the interface connectors and the second signal pad respectively.

13. The IC according to claim 1, wherein the packaging body comprises:
a encapsulating material, encapsulating the functional chip and the ESD protection chip.

14. The IC according to claim 1, wherein the functional chip is a chip without an ESD protection circuit.

15. The IC according to claim 1, wherein the functional chip is fabricated using process technology more advanced than different from that of the ESD protection chip.

16. The IC according to claim 1, wherein the interface connectors are a plurality of pins or solder balls.

17. An integrated circuit (IC), comprising:
a packaging body;
a plurality of interface connectors, disposed on an outer surface of the packaging body;
a functional chip, comprising:
a first power pad, connected electrically to a first one of the interface connectors;
a first ground pad, connected electrically to a second one of the interface connectors;
a first signal pad; and
an electronic functional circuit, connected electrically to the first power pad, the first signal pad, and the first ground pad; and
an Electrostatic Discharge (ESD) protection chip, comprising:
a second signal pad, connected electrically between a third one of the interface connectors and the first signal pad; and
a first ESD protection circuit, connected electrically to the second signal pad;
wherein the functional chip further comprises:
a third ESD protection circuit, coupled between the first power pad and the first signal pad; and
a fourth ESD protection circuit, coupled between the first signal pad and the first ground pad; and
wherein a current-withstanding capability of each ESD protection circuit in the functional chip is weaker than a current-withstanding capability of each ESD protection circuit in the ESD protection chip.

18. An integrated circuit (IC), comprising:
a packaging body;
a plurality of interface connectors, disposed on an outer surface of the packaging body;
a functional chip, comprising:
a first power pad, connected electrically to a first one of the interface connectors;
a first ground pad, connected electrically to a second one of the interface connectors;
a first signal pad; and
an electronic functional circuit, connected electrically to the first power pad, the first signal pad, and the first ground pad;
an Electrostatic Discharge (ESD) protection chip, comprising:
a second signal pad, connected electrically between a third one of the interface connectors and the first signal pad; and
a first ESD protection circuit, connected electrically to the second signal pad; and
a plurality of jointers, jointed between the first one of the interface connectors and the first power pad, between the second one of the interface connectors and the first ground pad, and between the third one of the interface connectors and the second signal pad respectively.

* * * * *